US007830002B2

(12) United States Patent
Cok et al.

(10) Patent No.: US 7,830,002 B2
(45) Date of Patent: Nov. 9, 2010

(54) DEVICE WITH CHIPLETS AND ADAPTABLE INTERCONNECTIONS

(75) Inventors: Ronald S. Cok, Rochester, NY (US);
Dustin L. Winters, Webster, NY (US);
John W. Hamer, Rochester, NY (US);
Todd M. Spath, Hilton, NY (US)

(73) Assignee: Global OLED Technology LLC, Wilmington, DE (US)

( * ) Notice: Subject to any disclaimer, the term of this patent is extended or adjusted under 35 U.S.C. 154(b) by 213 days.

(21) Appl. No.: 12/264,457

(22) Filed: Nov. 4, 2008

(65) Prior Publication Data

US 2010/0109166 A1    May 6, 2010

(51) Int. Cl.
*H01L 23/52* (2006.01)
(52) U.S. Cl. ................. 257/723; 257/776; 257/E23.141
(58) Field of Classification Search ................. 257/776, 257/723, E23.141
See application file for complete search history.

(56) References Cited

U.S. PATENT DOCUMENTS 6,384,529 B2    5/2002    Tang et al.
6,879,098 B2 *  4/2005    Buchwalter et al. ......... 313/500
6,919,681 B2    7/2005    Cok et al.
6,987,355 B2    1/2006    Cok
7,230,594 B2    6/2007    Miller et al.
2006/0055864 A1  3/2006   Matsumura et al.

FOREIGN PATENT DOCUMENTS

WO    WO 00/49658 A1    8/2000
WO    WO 2008/026573    3/2008

* cited by examiner

*Primary Examiner*—Roy K Potter
(74) *Attorney, Agent, or Firm*—Morgan Lewis & Bockius LLP

(57) ABSTRACT

An active-matrix device includes a device substrate including a plurality of pixels formed thereon, each pixel having a separate control electrode, a plurality of chiplets having at least first and second corresponding chiplets disposed at different locations over the device substrate, a plurality of wires formed over the device substrate, each wire being connected to a connection pad and to a different pixel control electrode, and wherein the shape of at least one of the wires connecting a connection pad for the first chiplet is different from the shape of at least one of the wires connecting a corresponding connection pad for the second chiplet.

11 Claims, 10 Drawing Sheets

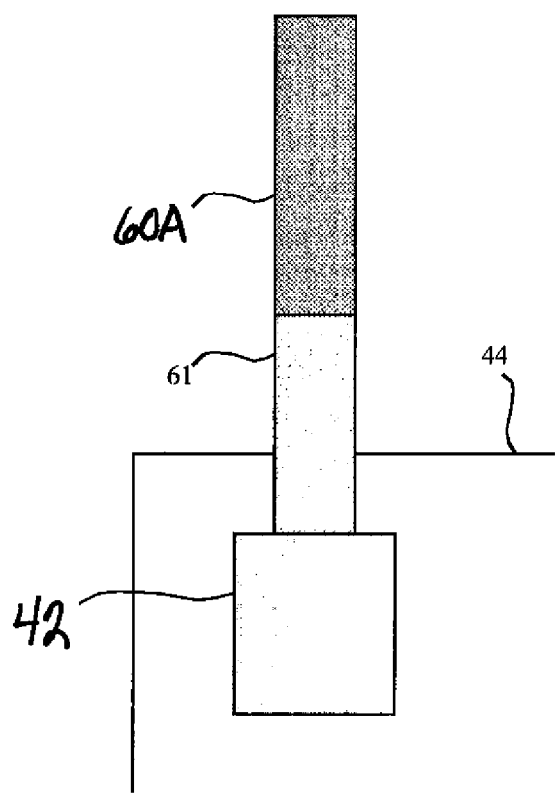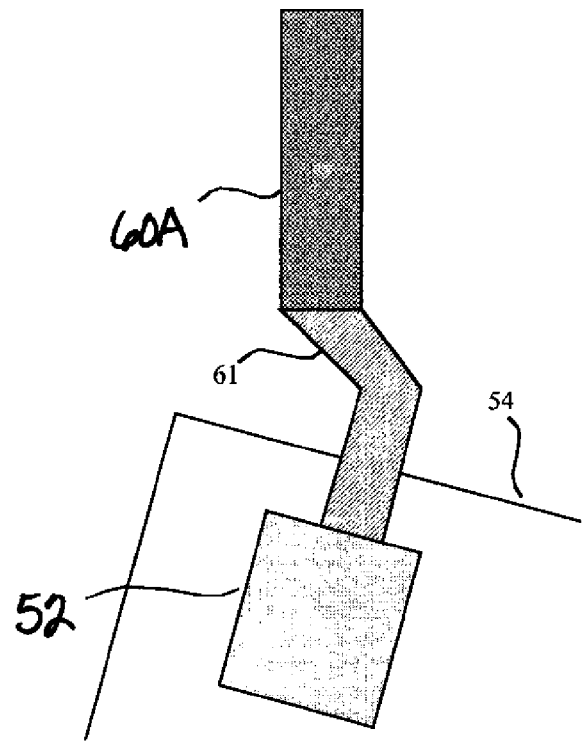
FIG. 8A                    FIG. 8B

DEVICE WITH CHIPLETS AND ADAPTABLE INTERCONNECTIONS

CROSS-REFERENCE TO RELATED APPLICATIONS

The present application is related to U.S. application Ser. No. 12/191,462, filed Aug. 14, 2008, by Cok et al., and entitled, "Display Device With Chiplets.

FIELD OF THE INVENTION

The present invention relates to display devices having a substrate with distributed, independent control elements and, in particular, distributed, independent control elements with adaptable interconnections.

BACKGROUND OF THE INVENTION

Flat-panel display devices are widely used in conjunction with computing devices, in portable devices, and for entertainment devices such as televisions. Such displays typically employ a plurality of pixels distributed over a substrate to display images. Each pixel incorporates several, differently colored light-emitting elements commonly referred to as sub-pixels, typically emitting red, green, and blue light, to represent each image element. A variety of flat-panel display technologies are known, for example plasma displays, liquid crystal displays, and light-emitting diode displays.

Light emitting diodes (LEDs) incorporating thin films of light-emitting materials forming light-emitting elements have many advantages in a flat-panel display device and are useful in optical systems. U.S. Pat. No. 6,384,529 issued May 7, 2002 to Tang et al. shows an organic LED (OLED) color display that includes an array of organic LED light-emitting elements. Alternatively, inorganic materials can be employed and can include phosphorescent crystals or quantum dots in a polycrystalline semiconductor matrix. Other thin films of organic or inorganic materials can also be employed to control charge injection, transport, or blocking to the light-emitting-thin-film materials, and are known in the art. The materials are placed upon a substrate between electrodes, with an encapsulating cover layer or plate. Light is emitted from a pixel when current passes through the light-emitting material. The frequency of the emitted light is dependent on the nature of the material used. In such a display, light can be emitted through the substrate (a bottom emitter) or through the encapsulating cover (a top emitter), or both.

LED devices can comprise a patterned light-emissive layer wherein different materials are employed in the pattern to emit different colors of light when current passes through the materials. Alternatively, one can employ a single emissive layer, for example, a white-light emitter, together with color filters for forming a full-color display, as is taught in U.S. Pat. No. 6,987,355 entitled, "Stacked OLED Display Having Improved Efficiency" by Cok. It is also known to employ a white sub-pixel that does not include a color filter, for example, as taught in U.S. Pat. No. 6,919,681 entitled, "Color OLED Display With Improved Power Efficiency" by Cok et al. A design employing an unpatterned white emitter has been proposed together with a four-color pixel comprising red, green, and blue color filters and sub-pixels and an unfiltered white sub-pixel to improve the efficiency of the device (see, e.g. U.S. Pat. No. 7,230,594 issued Jun. 12, 2007 to Miller, et al.).

Two different methods for controlling the pixels in a flat-panel display device are generally known: active-matrix and passive-matrix control. In an active-matrix device, control elements are distributed over the flat-panel substrate. Typically, each sub-pixel is controlled by one control element and each control element includes at least one transistor. For example, in a simple active-matrix organic light-emitting (OLED) display, each control element includes two transistors (a select transistor and a power transistor) and one capacitor for storing a charge specifying the brightness of the sub-pixel. Each light-emitting element typically employs an independent control electrode and a common electrode. Active-matrix elements are not necessarily limited to displays and can be distributed over a substrate and employed in other applications requiring spatially distributed control.

One common, prior-art method of forming active-matrix control elements typically deposits thin films of semiconductor materials, such as silicon, onto a glass substrate and then forms the semiconductor materials into transistors and capacitors through photolithographic processes. The thin-film silicon can be either amorphous or polycrystalline. Thin-film transistors (TFTs) made from amorphous or polycrystalline silicon are relatively large and have lower performance compared to conventional transistors made in crystalline silicon wafers. Moreover, such thin-film devices typically exhibit local or large-area non-uniformity across the glass substrate that results in non-uniformity in the electrical performance and visual appearance of display employing such materials.

Matsumura et al. describe one prior-art description of crystalline silicon substrates used for driving LCD displays in US Patent Publication No. 2006/0055864. The Publication describes a method for selectively transferring and affixing pixel-control devices made from first semiconductor substrates onto a second planar display substrate. Wiring interconnections within the pixel-control device and connections from busses and control electrodes to the pixel-control device are shown.

It has been observed that significant positional variability can occur when mounting semiconductor devices onto a display device in terms of alignment to pre-existing patterns (x/y alignment) and rotational skew (theta alignment). Since the display substrate is typically much larger in terms of surface area than the initial semiconducting substrates, the transfer must occur in several steps or motions in order to populate an array the size of the final display. Thus, interconnecting large arrays of chiplets using conventional photolithographic techniques, particularly for chiplets with small connection pads, can be problematic and result in lower-than-desired device yields.

There is a need, therefore, for an improved method for interconnecting chiplets on a large substrate.

SUMMARY OF THE INVENTION

The need is met in one embodiment of the present invention by an active-matrix device, comprising: a) a device substrate including a plurality of pixels formed thereon, each pixel having a separate control electrode; b) a plurality of chiplets having at least a first and a second corresponding chiplet disposed at different locations over the device substrate; c) a plurality of wires formed over the device substrate, each wire being connected to a connection pad and to a different pixel control electrode; and d) wherein the shape of at least one of the plurality of wires connecting a connection pad for the first chiplet is different from the shape of at least one of the plurality of wires connecting a corresponding connection pad for the second chiplet.

ADVANTAGES

The present invention has the advantage that, by providing differently shaped wires for corresponding first and second chiplets with corresponding connection pads, thereby facilitating correct connections, reducing defects, and improving yields.

BRIEF DESCRIPTION OF THE DRAWINGS

FIG. 8A is a detail partial plan view of a portion of a substrate with a properly-oriented chiplet and a control wire connected to a connection pad; and FIG. 8B is a detail partial plan view of a portion of a substrate with an improperly-oriented chiplet and a control wire having an adapted interconnection according to an alternative embodiment of the present invention.

DETAILED DESCRIPTION OF THE INVENTION

In one embodiment, the present invention comprises an active-matrix device including a device substrate having a plurality of pixels formed thereon, each pixel having a separate control electrode. A plurality of chiplets having at least first and second corresponding chiplets is disposed at different locations over the device substrate. The first and second chiplets are typically rectangular and may have different orientations with respect to the device substrate. A plurality of wires is formed over the device substrate, each wire being connected to a different connection pad and to a different pixel control electrode. The connection pads are located on the chiplets and each chiplet has at least one connection pad. Each connection pad on a chiplet has a unique location on that chiplet. The location of each connection pad on each chiplet, with respect to that chiplet, is the same for each chiplet so that each connection pad on the first chiplet has a corresponding connection pad in a similar, corresponding location on the second corresponding chiplet. Hence, two connection pads on two different chiplets correspond when the location of each connection pad on its chiplet is the same with respect to that chiplet. The shape of at least one of the wires connecting a connection pad for the first chiplet is different from the shape of at least one of the wires for connecting a corresponding connection pad on the second corresponding chiplet. As used herein, a pixel is a single light-emitting element. For example, a multicolored device could have three different pixels for emitting red, green, and blue light. A chiplet has a separate and independent substrate from the device substrate and the chiplet substrates are formed separately from the device substrate and then located on the device substrate.

Figure 1A:
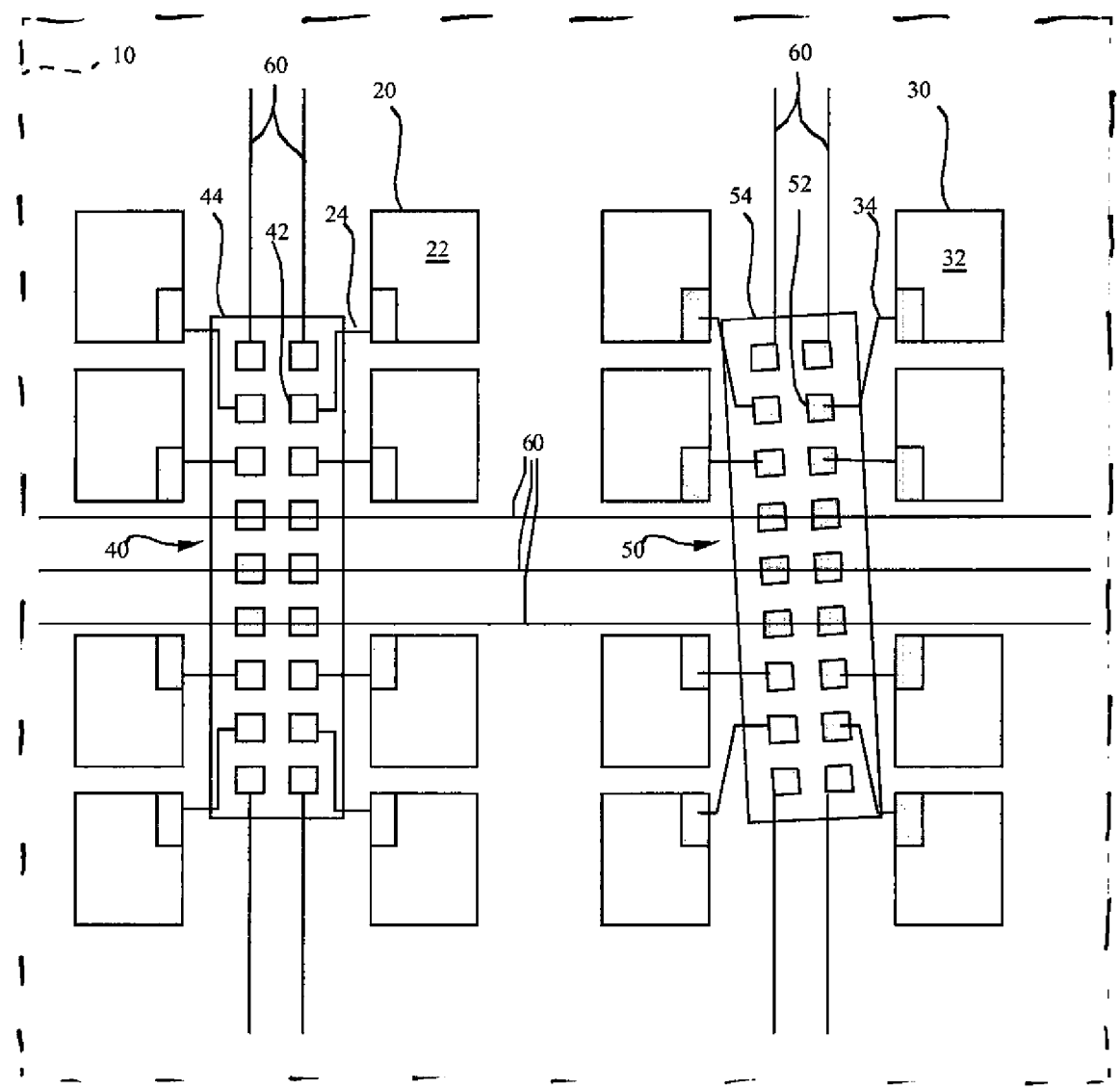
FIG. 1A is a partial plan view of a portion of a substrate having chiplets according to an embodiment of the present invention.
Figure 1B:
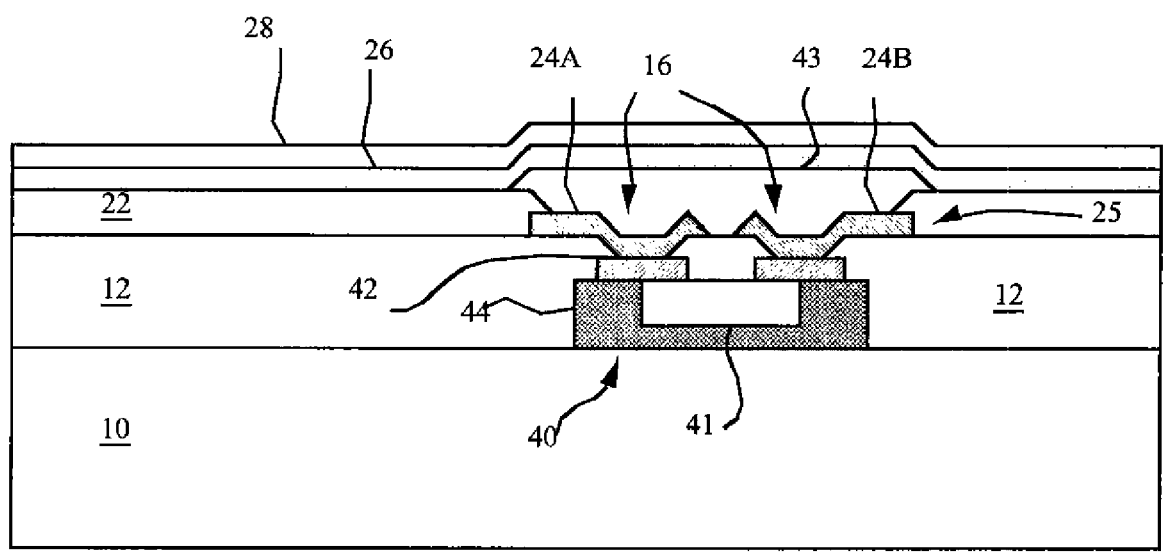
FIG. 1B is a cross-section of a portion of a substrate with a chiplet according to an embodiment of the present invention.

Referring to FIG. 1A in a partial plan view and FIG. 1B in a cross-section view, according to an embodiment of the present invention a multi-pixel device includes a device substrate 10, a plurality of pixels 20, 30 formed over the device substrate 10, each pixel 20, 30 including a control electrode 22, 32. A plurality of chiplets 40, 50 for controlling one or more of the plurality of pixels 20, 30 is located over the device substrate 10, each chiplet 40, 50 including circuitry 41, one or more connection pads 42, 52, and a chiplet substrate 44, 54 independent of the device substrate 10, and wherein each chiplet 40, 50 has a unique pre-determined location and orientation. The connection pads 42, 52, correspond since connection pad 42 has the same location on chiplet 40 as connection pad 52 has on chiplet 50. At least one of the chiplets 50 has a location or orientation different from the pre-determined location and orientation for that chiplet and relatively different from the location or orientation of at least one other, corresponding chiplet 40 of the plurality of chiplets. A plurality of wires 24, 34 is formed over the device substrate 10, each wire 24, 34 electrically connecting one of the one or more connection pads 42, 52 to a different control electrode 22, 32 of one of the array of pixels 20, 30. At least one of the plurality of wires 24 connecting a connection pad 42 follows a path having a shape over the device substrate 10 different from the shape of a path of another of the plurality of wires 34 connecting a corresponding connection pad 52. A pixel definition layer 43 can be employed to prevent shorts between adjacent wires. Signal and buss lines 60 connect external control devices (not shown) to the chiplets 40, 50 to control the chiplets and the pixels 20, 30. As taught herein, the relative location or orientation of a chiplet is the location or orientation of the chiplet relative to the pre-determined location of the chiplet. The pre-determined location of each chiplet will be unique, and the orientation with respect to the device substrate of pixels can be unique, but the relative location or orientation is the difference between the actual location or orientation of a chiplet and the desired, pre-determined location and orientation.

The pre-determined locations and orientations of the chiplets over the device substrate are the desired locations and orientations of the chiplets. However, according to the present invention, because of manufacturing tolerances and process error, at least one chiplet is located or oriented incorrectly and in a different manner from another chiplet. In a completely controlled manufacturing process, the chiplets are exactly and correctly located and the wires interconnecting the control electrodes and connection pads can be formed through well-known photolithographic processes employing preformed masks. In a less well-controlled manufacturing process, all of the chiplets are misaligned in the same way (e.g. all of the chiplets are shifted in location the same amount or rotated the same amount) and the pre-formed mask can be aligned to correct for the chiplet positions. However, according to the present invention, at least one of the chiplets is misaligned differently from the other chiplets. Hence, a pre-formed mask cannot be employed to correctly connect the control electrodes and connection pads associated with the differently misaligned chiplet and an interconnection must be adapted to the location of the differently misaligned chiplet. The present invention, therefore, has the advantage of improving yields for chiplet-based, multi-pixel devices formed on a device substrate.

Embodiments of the present invention can be constructed by first providing a device substrate 10 and a plurality of chiplets 40, 50 having the desired circuitry and connection pads 42, 52. The device substrate 10 can be coated with an adhesive and the chiplets 40, 50 located on the adhesive over the device substrate 10, for example by a mechanical pick-and-place machine or by the methods taught in co-pending, commonly assigned U.S. patent application Ser. Nos. 12/191, 478 and 12/191,462, which are hereby included by reference in their entirety. However, the placement accuracy of the chiplets 40, 50 is imperfect, resulting in chiplet 50 whose location and orientation is not exactly as desired with respect to a pre-determined location and orientation. In one embodiment of the present invention, the chiplets 40, 50 and pixels 20, 30 are desirably positioned in an array of pre-determined locations over the device substrate 10. In general, an array of locations will be regular in each of two dimensions over the extent of the device substrate 10. However, in some embodiments of the present invention, the array locations are irregular.

Once the chiplets 40, 50 are located on the device substrate 10, regardless of location and orientation, the device substrate 10 can then be planarized using a commercially available resin (e.g. benzocyclobutene) to form a planarization layer 12 to further protect the chiplets 40, 50 and to form a surface on which a pixel can be constructed. A photosensitive resin can be coated over the planarization layer. However, according to the present invention, because the rotation or location of one of the chiplets 50 is not as desired, the exact location of the chiplet 50 connection pads 52 is not known. According to various embodiments of the present invention, the locations of the chiplets 40, 50 are automatically determined using, for example, an imaging sensor to capture an image of the device substrate 10 and using image processing software to extract the locations of the connection pads 42, 52. Routing software, for example similar to that used for printed circuit board or integrated circuit automated layout, can then be employed to find a shaped path for each wire from the control electrode 22, 32 to the connection pad 42, 52, respectively. In an alternative embodiment of the present invention, a pre-determined set of paths having pre-determined shapes can be provided and a selection of one of the set of paths made depending on the locations of the connection pads relative to the control electrode to which it is to be electrically connected. This embodiment reduces operating time by pre-computing a set of useful paths.

If all chiplets are located and oriented as desired, then there are no chiplets having different locations and orientations and a standard photolithographic masking process can be used to form wires in a wiring layer to connect the control electrodes to the connection pads. However, according to the present invention, at least one chiplet has a different location and orientation and a path shape must be found to connect the corresponding chiplet connection pads to the corresponding control electrodes. Hence, for a chiplet having a different relative location or orientation with respect to the desired, pre-determined location and orientation and for which a connection pad is in the same position with respect to the chiplet as another corresponding connection pad is with respect to another chiplet having a different location or orientation, a wire electrically connecting the connection pad to the control electrode will follow a path having a shape different from the shape of another path followed by the other wire electrically connecting the other corresponding connection pad to the other control electrode.

Once the paths are determined for each wire connecting each control electrode to each connection pad, vias (openings) 16 can be formed in the resin using a laser, for example by ablation or by using a photosensitive resin so that each connection pad for each chiplet is exposed through a via 16. A metal layer can then be deposited over the planarization layer and the connection pads and a subsequent photosensitive resin coated. The resin coating can then be exposed using the determined locations of the pads and the control electrodes. Again, a laser exposure can be employed. Alternatively, a mask exposure can be employed together with a laser to expose the photosensitive resin. Useful lasers include single-spot lasers with opto-mechanical addressing systems or lasers with multi-channel heads incorporating diode lasers having a spot size, for example of 2 to 10 µm diameter, or as disclosed in U.S. Pat. No. 6,995,035. A following etch step can pattern the metal layer and the remaining photosensitive resin stripped. In an alternative method, a conductive ink can be deposited over the substrate (for example by in inkjet device) in the desired path and then cured. The subsequent steps of forming the control electrodes 24A, 24B and pixels, e.g. an OLED pixel with a light-emitting layer 26 and a common electrode 28 are known in the art. Note that the control electrodes 22 typically define the pixel 20 area so that the control electrode 22 and the pixel 20 have a common extent over the device substrate 10.

Figure 2A:
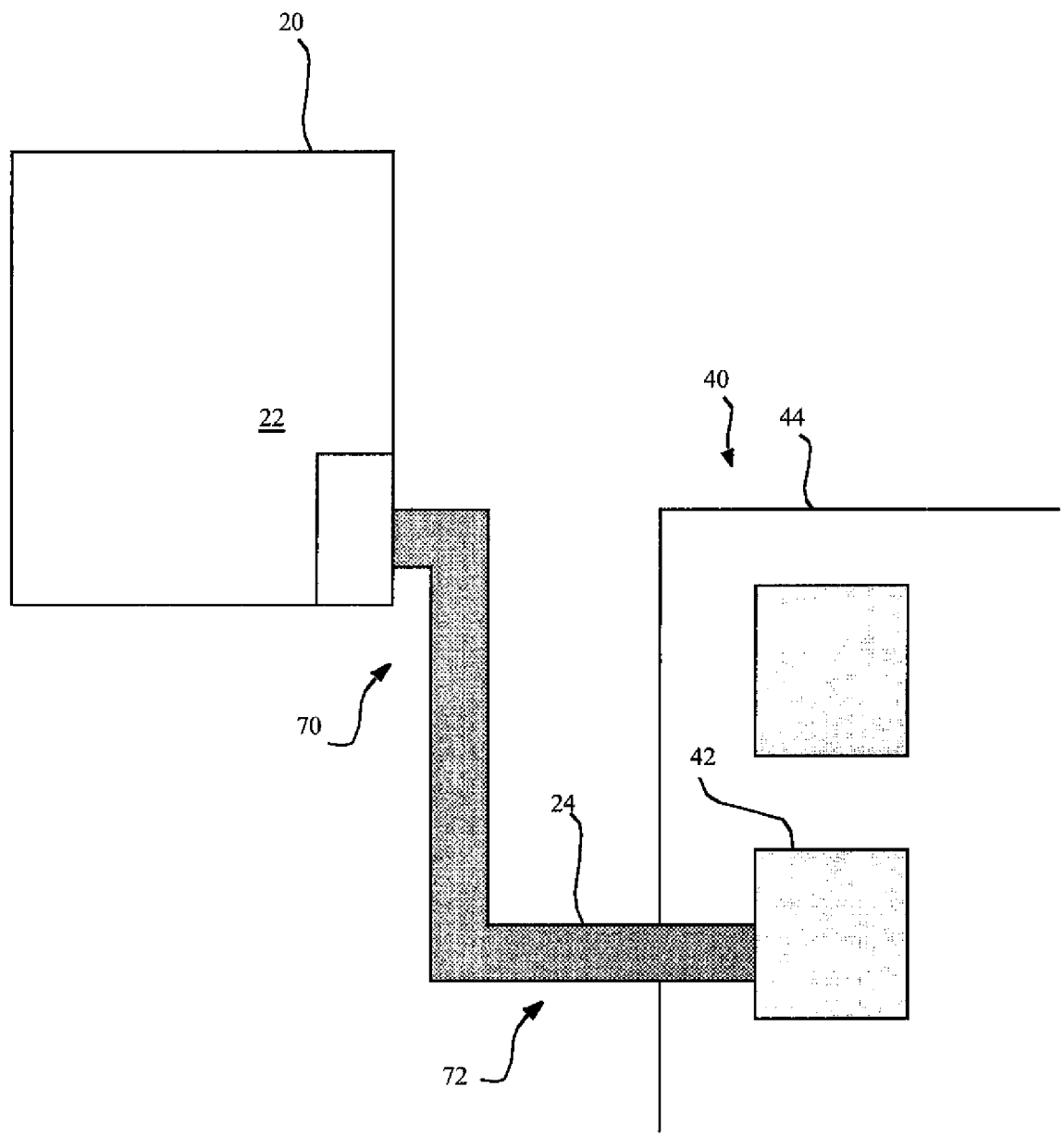
FIG. 2A is a detail partial plan view of a portion of a substrate with a properly-oriented chiplet according to an embodiment of the present invention.
Figure 2B:
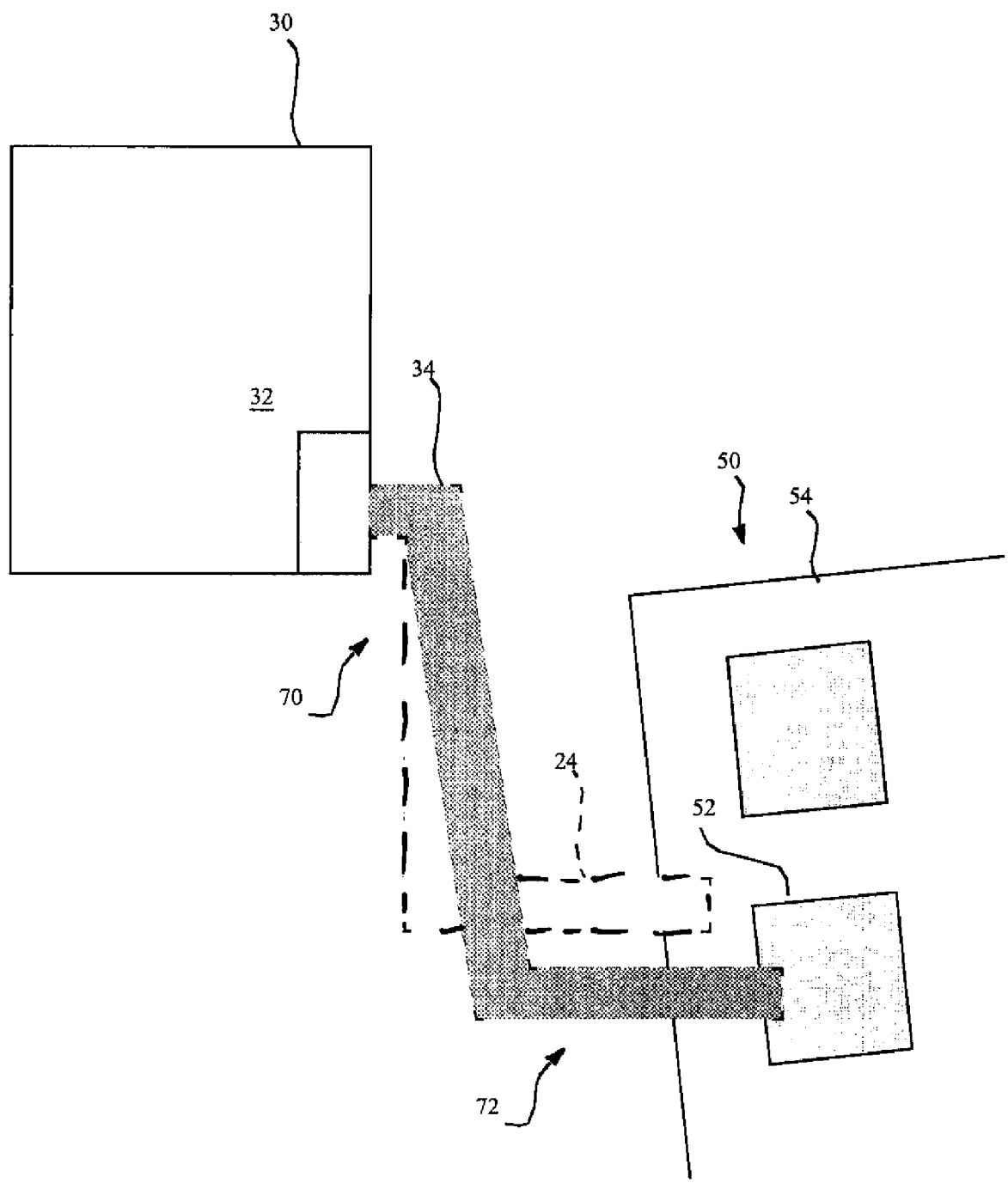
FIG. 2B is a detail partial plan view of a portion of a substrate with an improperly-oriented chiplet and an adapted interconnection according to an embodiment of the present invention.
Figure 3A:
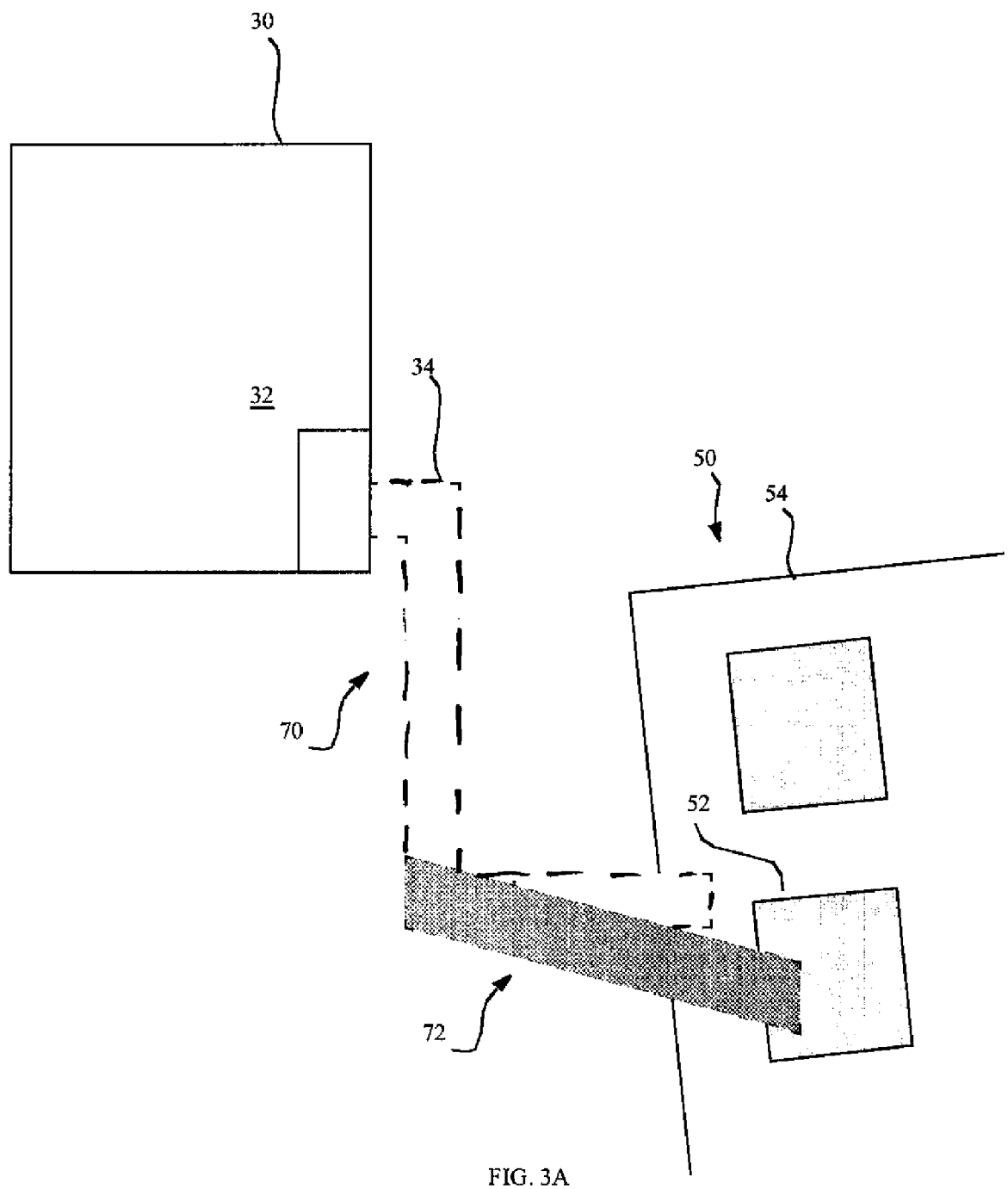
FIG. 3A is a detail partial plan view of a portion of a substrate with an improperly-oriented chiplet and an adapted interconnection according to an alternative embodiment of the present invention.
Figure 3B:
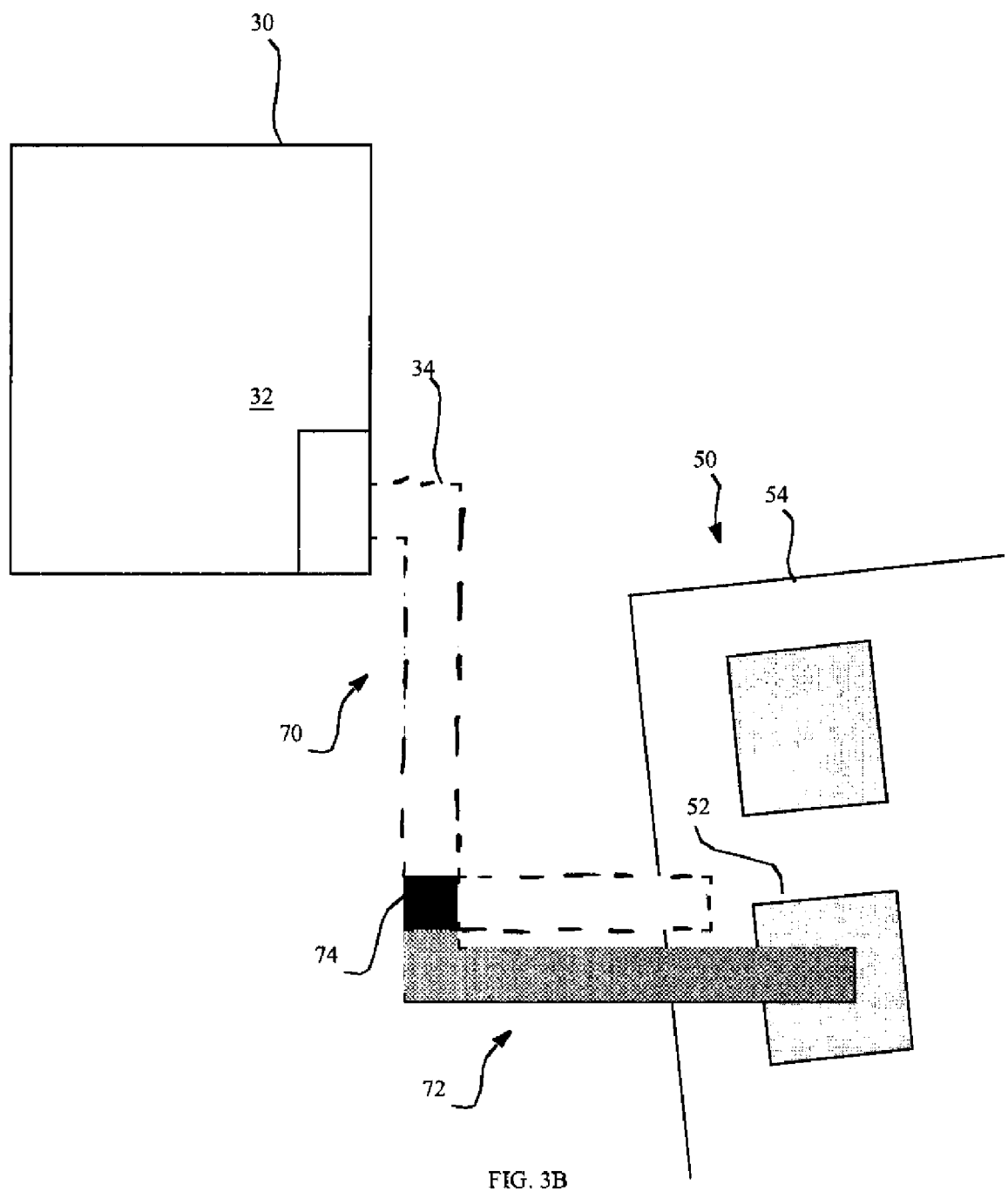
FIG. 3B is a detail partial plan view of a portion of a substrate with an improperly-oriented chiplet and an alternative adapted interconnection according to an alternative embodiment of the present invention.

Since the locations of the control electrodes are not dependent on the orientations of the chiplets, the path the wires follow can be divided into electrode portions electrically connected to the control electrodes and pad portions electrically connected to the connection pads and to the first and second electrode portions, respectively, as shown in FIG. 2A. Referring to FIG. 2B, in one embodiment of the present invention, the entire path including both the electrode portion 70 and the pad portion 72 can be uniquely determined. In an alternative embodiment illustrated in FIGS. 3A and 3B, the electrode portions 70 have a similar path shape and the pad portions 72 have a different path shape. In FIGS. 2B, 3A, and 3B, the path for the desired, pre-determined location is shown with dashes while the adapted path is shown with a different marking. In this embodiment, a standard mask can be used to expose the electrode portion 70, while the pad portion 72 can be uniquely determined and exposed, for example by a laser. The stitching point 74 indicates where the pad portion 72 and electrode portion 70 connect. Such a division of labor can improve throughput since the unique, laser-exposed portion is reduced in length and the standard mask portion can be exposed in a single exposure, reducing the total exposure time. Referring to FIG. 3B, in a further process, the shape of the wire path (comprising pad and electrode portions) can be constrained to be rectilinear. This constraint can be useful in that laser exposure systems under digital x, y control hardware tend to be better at tracing rectilinear lines or exposure paths. Moreover, by employing a static electrode portion 70 together with an adaptive pad portion 72 joined at a stitching point 74 together with a rectilinear geometry routing constraint or a set of pre-determined routing options, the path and shape can be determined in real time as a laser exposure system writes pathways on the device substrate. The local wiring patterns can be independently and rapidly computed using a simple three-parameter function (corresponding to the three degrees of freedom in a planar system) and is advantaged over computation from a net-list with conventional routing software. Thus, inspection and patterning can be combined in real time with a consequent savings in manufacturing costs.

Figure 4:
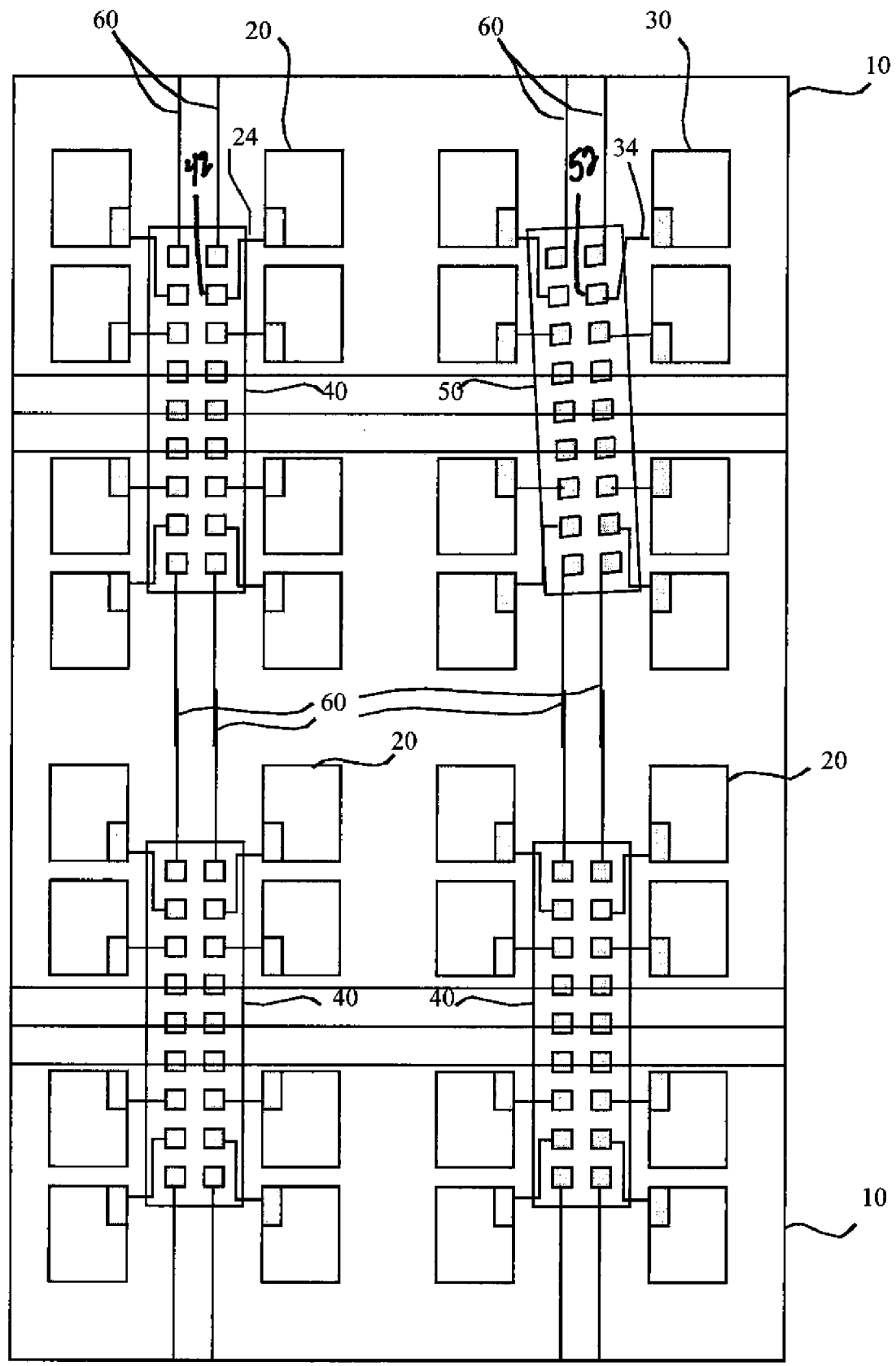
FIG. 4 is a larger-scale partial plan view of a portion of a substrate having chiplets according to an embodiment of the present invention.

Referring to FIG. 4, in a useful embodiment of the present invention, the multi-pixel device can comprise an array, for example a regular, rectangular array, of chiplets having a plurality of connection pads and an array of pixels, each connection pad of each chiplet connected by a wire to the control electrode of a pixel. As noted above, the center of the chiplet is desirably aligned in the array, but according to various embodiments, the orientation or location of at least two chiplets with respect to the device substrate is different. Such differences in orientation or location can result from a misplacement of a chiplet with respect to the array, either by locating the chiplet incorrectly with respect to the array (so that the center of one or more chiplets in the array is not aligned in the array) or by rotating the chiplet incorrectly. As shown in FIG. 4, some of the wires (e.g. 34 connected to a connection pad (e.g. 52) on chiplet 50 have a different shape than the wires (e.g. 24) connected to a connection pad (e.g. 42) on chiplet 40.

In an alternative embodiment of an active-matrix device, a device substrate has one or more control wires formed thereon; a plurality of pixels are formed over the device substrate, each pixel including a control electrode; a plurality of chiplets for controlling one or more of the plurality of pixels is located over the device substrate, each chiplet having a substrate independent of the device substrate including circuitry and a plurality of connection pads, and each chiplet has a pre-determined location and orientation on the device substrate A first chiplet corresponding to a second chiplet has a location or orientation different from the pre-determined location and orientation of the first chiplet. A plurality of wires is formed over the device substrate, each wire electrically connecting one of the connection pads and a different control electrode of a pixel, or a control line, for the first and second chiplets and wherein the shape of at least one of the wires for the first chiplet are different from the shape of at least one of the wires for the second chiplet. As noted above, the present invention is useful for connecting connection pads to pixel control electrodes when a driving chiplet is misplaced on a substrate. The present invention is also useful for connecting control wires (including but not limited to power, ground, data, and select wires) carrying control or power signals to a chiplet connection pad. Hence, the shape of a path connecting a control wire to a connection pad can also be adapted to compensate for a chiplet whose location or orientation is different from the pre-determined location or orientation. FIG. 8A illustrates a control wire 60A connected to a properly placed chiplet 44 and connection pad 42 using a pad portion 61 of a wire. In contrast, FIG. 8B illustrates a control wire 60A connected to an improperly placed corresponding chiplet 54 and connection pad 52 corresponding to connection pad 42 by employing a pad portion 61 having a shape different from the shape found in FIG. 8A.

According to various embodiments of the present invention, the chiplets can be constructed in a variety of ways, for example with one row of connection pads along the long dimension of the chiplet. Alternatively, the chiplets can have two rows of connection pads, as shown in FIGS. 1A, 1B, and 4. The interconnection wires can be formed from various materials and use various methods for deposition on the device substrate. For example, the interconnection wires can be metal, either evaporated or sputtered, for example aluminum or aluminum alloys. Alternatively, the interconnection wires can be made of cured conductive inks or metal oxides. In one cost-advantaged embodiment, the interconnection wires are formed in a single layer.

The present invention is particularly useful for multi-pixel device embodiments employing a large device substrate, e.g. glass, plastic, or foil, with a plurality of chiplets arranged in a regular array over the device substrate. Each chiplet can control one or more pixels formed over the device substrate according to the circuitry in the chiplet and in response to control signals. Pixels can be light-emitting elements, for example in a display device, or light-sensitive elements in a sensor, or a combination of such light-emitting or light-sensitive elements.

Figure 5:
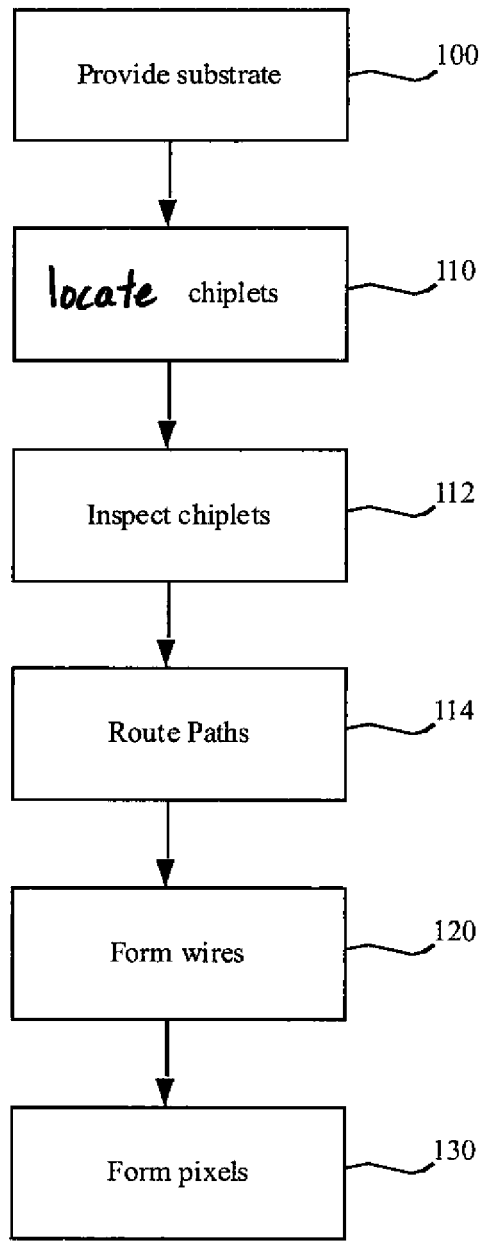
FIG. 5 is a flow graph illustrating a method according to an embodiment of the present invention.

Referring to FIG. 5, according to one embodiment of a method of the present invention, a multi-pixel device can be made by providing 100 a device substrate, locating 110 a plurality of chiplets for controlling one or more of the plurality of pixels over the device substrate, each chiplet including circuitry, one or more connection pads, and a chiplet substrate independent of the device substrate, and wherein each chiplet has a pre-determined location and orientation and at least one of the chiplets has a location or orientation different from the pre-determined location and orientation for that chiplet and relatively different from the location or orientation of at least one other chiplet of the plurality of chiplets. Once located, the chiplets are inspected 112, for example by employing digital camera and image analysis software. If any of the chiplets are misplaced, alternately-shaped paths are generated 114, where necessary, to form dynamically computed adapted paths. A plurality of wires is then formed 120 over the device substrate, each wire electrically connecting one of the one or more connection pads to a different control electrode of one of the array of pixels and wherein at least one of the plurality of wires follows a path shape over the device substrate different from the path shape of another of the plurality of wires, and forming 130 a plurality of pixels over the device substrate, each pixel including a control electrode.

Figure 7:
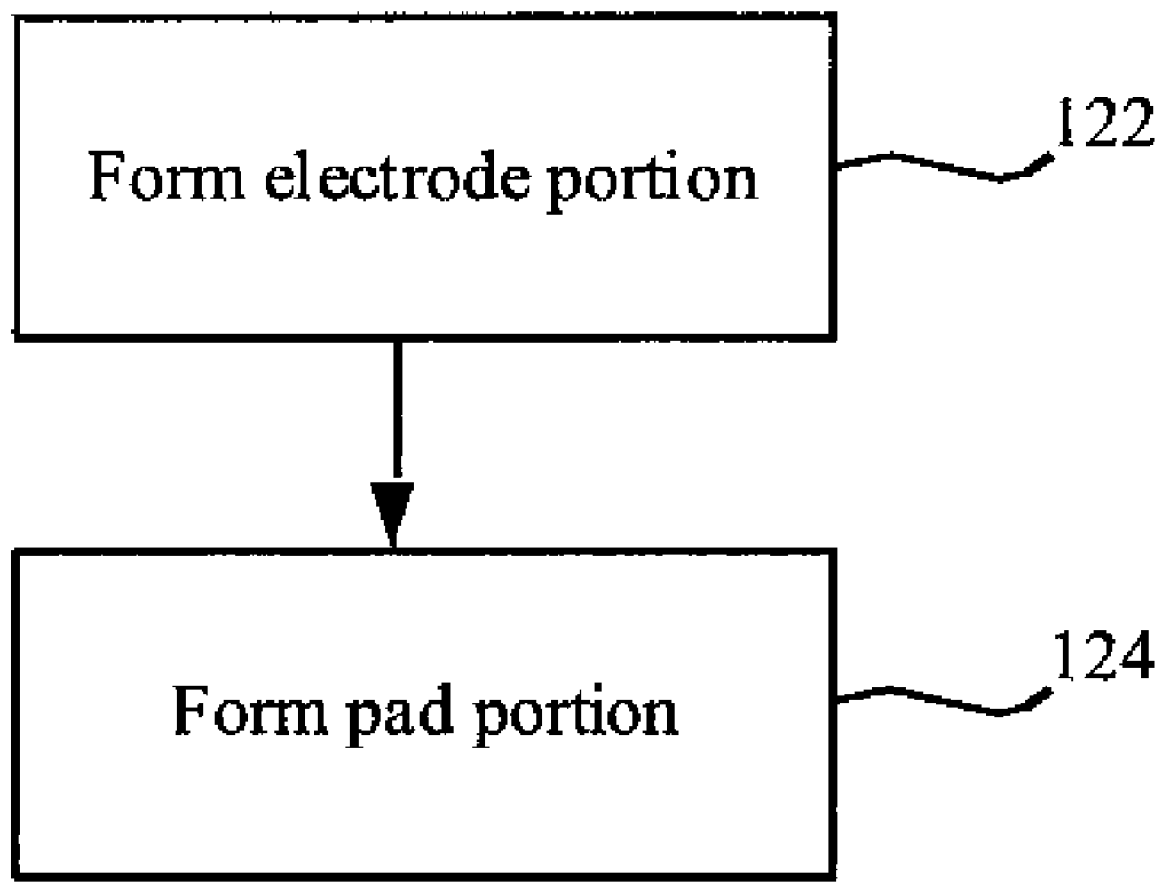
FIG. 7 is a flow graph illustrating the formation of two portions of a wire according to an embodiment of the present invention.

The method of the present invention can further include forming buss and signal wires over the device substrate to electrically connect the chiplets to an external controller. The plurality of wires and buss and signal wires can be formed in a common step and in a common layer. In a further embodiment of the present invention, each of the plurality of wires can include an electrode portion and pad portion and the electrode portions of at least two wires can be formed in a common step 122 and the pad portions of the two wires can be formed in separate steps 124 (FIG. 7). In various embodiments of the present invention, a dynamically controllable device can be employed to form the wires, signal lines, or busses and, in particular, the pad portions. Such a dynamically controllable device can be, for example, a laser exposure device or an inkjet deposition device.

Figure 6A:
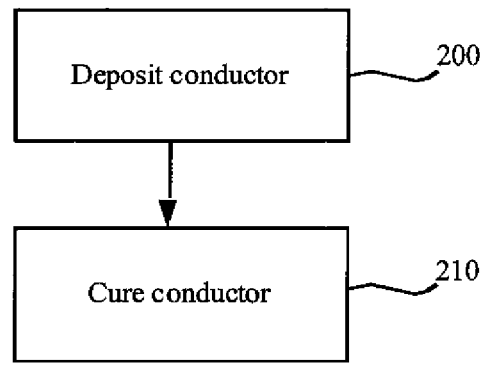
FIG. 6A is a flow graph illustrating the formation of a patterned conductor according to an embodiment of the present invention.
Figure 6B:
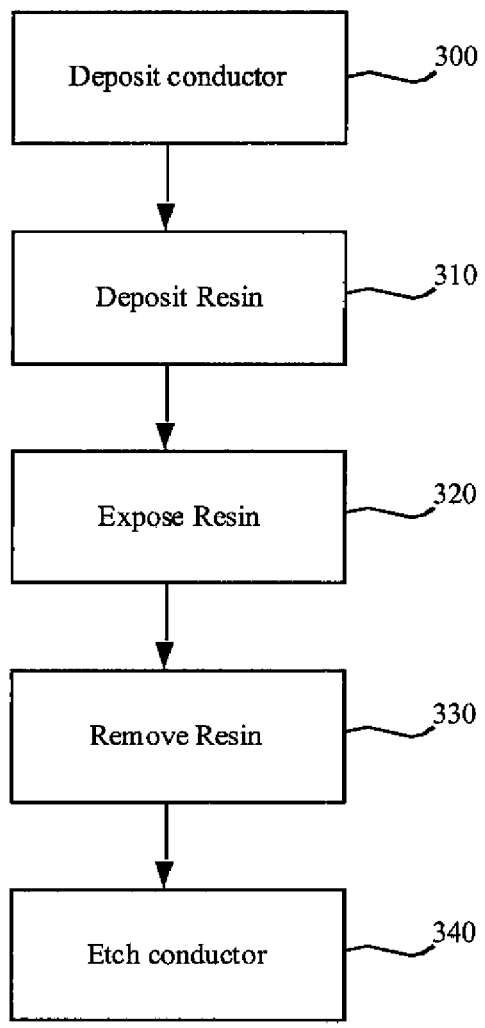
FIG. 6B is a flow graph illustrating the formation of a patterned conductor according to another embodiment of the present invention.

In various embodiments, an image of the connection pads and of the control electrodes can be made, the image of the relative positions and relative orientations of the connection pads and control electrodes analyzed, and a path connecting each of the connection pads to a different one of the control electrodes determined. A conductive wire can then be formed on the determined path using a dynamically controllable device. As intended herein, a dynamically controllable device is a device that can be controlled to form patterned wires over the device substrate in response to the determined locations of the chiplets after the chiplets have been located on the device substrate. Referring to FIG. 6A, for example, an inkjet deposition device can be employed to coat 200 and cure 210 a conductor in a path connecting at least one of the connection pads to at least one of the control electrodes. The coating step can be done in a pattern corresponding to the wire path or the curing step can be done in a pattern corresponding to the wire path and the uncured conductor material removed, for example by washing. Alternatively referring to FIG. 6B, a conductive layer (e.g. metal) can be coated 300 over the device substrate; a photosensitive material coated 310 over the conductive layer and pattern-wise exposed 320. The uncured resin can be removed 330 and the conductive layer etched 340 to form a path connecting at least one of the connection pads to at least one of the control electrodes.

A method of the present invention has been demonstrated by forming a connection pad and control electrode over a substrate, imaging the connection pad and control electrode, and analyzing the image to determine a path connecting the connection pad and control electrode. The substrate was then coated with a metal layer and photosensitive resin. The photosensitive resin was laser exposed according to the determined path to pattern-wise cure the photosensitive resin, and the photosensitive resin developed to pattern-wise expose the metal layer. The exposure frequency can be any of a variety of useful electro-magnetic frequencies, for example infra-red, ultra-violet, or visible light. A subsequent etching step then patterned the metal layer to form a wire connecting the connection pad and the control electrode.

As used herein, a pixel is any light-emitting or light-responsive element on a substrate. For example, in one embodiment of the present invention, a single organic or inorganic light-emitting diode element emitting light of any color and formed over a substrate is a pixel as intended herein. The terms "pixel," "sub-pixel," "light-emitting element" or "light-responsive element" all refer to a pixel as used herein. Arrays of such light-emissive pixels can be found in displays. In an alternative embodiment of the present invention, a light-responsive element, for example a light-sensitive diode or light-sensitive transistor, can be a pixel. Arrays of such light-sensitive pixels can be found in image sensors or solar cells. The pixels typically comprise a pair of electrodes formed on either side of a light-emissive or light-responsive material. In some embodiments (e.g. displays), one electrode is electrically connected in common and is unpatterned over the active area of the substrate while the second control electrode is formed only over the active area of each pixel.

As is further described in co-pending, commonly assigned U.S. patent application Ser. No. 12/191,462, which is hereby incorporated in its entirety by reference, the wiring layer can be largely parallel to the device substrate. Largely parallel is defined herein to mean the distance between the wiring layer and the substrate can vary somewhat over the substrate area but that the average distance between the wiring layer and the substrate is uniform for areas of one or several pixels in size. A multi-pixel device, as intended herein, is a device including a plurality of distributed control elements, for example an array of thin-film control circuits formed over a substrate wherein each control circuit is responsive to control signals and power busses to control a light-emitting element. However, according to the present invention, the distributed control elements are chiplets. A chiplet is a relatively small integrated circuit compared to the device substrate and includes a circuit including wires, connection pads, passive components such as resistors or capacitors, or active components such as transistors or diodes, formed on an independent substrate. Chiplets are separately manufactured from the display substrate and then applied to the display substrate. The chiplets are preferably manufactured using silicon or silicon on insulator (SOI) wafers using known processes for fabricating semiconductor devices. Each chiplet is then separated prior to attachment to the device substrate. The crystalline base of each chiplet can therefore be considered a substrate separate from the device substrate and over which the chiplet's circuitry is disposed. The plurality of chiplets therefore has a corresponding plurality of substrates separate from the device substrate and each other. In particular, the independent substrates are separate from the substrate on which the pixels are formed and the areas of the independent chiplet substrates, taken together, are smaller than the device substrate. Chiplets can have a crystalline substrate to provide higher performance active components than are found in, for example, thin-film amorphous or polycrystalline silicon devices. Chiplets can have a thickness preferably of 100 µm or less, and more preferably 20 µm or less. This facilitates formation of the adhesive and planarization material over the chiplet that can then be applied using conventional spin-coating techniques. According to one embodiment of the present invention, chiplets formed on crystalline silicon substrates are arranged in a geometric array and adhered to a device substrate with adhesion or planarization materials. Connection pads on the surface of the chiplets are employed to connect each chiplet to signal wires, power busses, and control electrodes to drive pixels through control-line wires formed over the substrate. Chiplets can control one, several, or many pixels. However, it is preferred that each chiplet control at least two pixels.

Since the chiplets are formed in a semiconductor substrate, the circuitry of the chiplet can be formed using modern lithography tools. With such tools, feature sizes of 0.5 microns or less are readily available. For example, modern semiconductor fabrication lines can achieve line widths of 90 nm or 45 nm and can be employed in making the chiplets of the present invention. Therefore, the circuitry of the chiplet for driving the pixels, such as a two-transistor active-matrix circuit for each pixel, can be made small. Alternatively, the chiplet can incorporate a passive-matrix controller. The chiplet, however, also requires connection pads for making electrical connection to the wiring layer provided over the chiplets once assembled onto the display substrate. The connection pads must be sized based on the feature size of the lithography tools used on the display substrate (for example 5 µm) and the alignment of the chiplets to the wiring layer (for example +/−5 µm). Therefore, the connection pads can be, for example, 15 µm wide with 5 µm spaces between the pads. This means that the pads will generally be significantly larger than the transistor circuitry formed in the chiplet.

The pads can generally be formed in a metallization layer on the chiplet over the transistors. It is desirable to make the chiplet with as small a surface area as possible to enable a low manufacturing cost. Therefore, the size and number of the connection pads and not the transistors will generally limit the size of the chiplet.

The present invention provides a distributed-control device with improved yields. By employing chiplets with independent substrates (e.g. comprising crystalline silicon) having circuitry with higher performance than circuits formed directly on the substrate (e.g. amorphous or polycrystalline silicon), a device with higher performance is provided. Since crystalline silicon has not only higher performance but much smaller active elements (e.g. transistors), the circuitry size is much reduced so that the chiplet size is determined by the number and spacing of connection pads necessary to control and power the device. A useful chiplet can also be formed using micro-electro-mechanical (MEMS) structures, for example as described in "A novel use of MEMs switches in driving AMOLED," by Yoon, Lee, Yang, and Jang, Digest of Technical Papers of the Society for Information Display, 2008, 3.4, p. 13.

The device substrate can comprise glass and wiring layers made of evaporated or sputtered metal, e.g. aluminum or silver, formed over a planarization layer (e.g. resin) patterned with photolithographic techniques known in the art. The chiplets can be formed using conventional techniques well established in the integrated circuit industry.

In one light-emitting embodiment, the present invention can operate as follows. The chiplet multi-pixel control elements contain circuitry including charge-storage elements (e.g. capacitors), active elements (e.g. transistors) responsive to signals for charge deposition in the charge-storage elements, a power buss, and drive elements for controlling current or voltage from the power buss. Drive elements (e.g. power transistors) respond to the charge-storage elements to drive current through the control lines. Such circuits are known in the art, for example to drive organic or inorganic light-emitting diode devices. Control signals are provided to deposit charge in the charge-storage element. The drive transistor responds to the charge-storage element to drive current through the control lines to the control electrode and pixel. Useful signal and control methods are known in the art. Such an operation can be useful in, for example, organic or inorganic LED display devices. The above-referenced patent application, U.S. patent application Ser. No. 12/191,462 also provides further details on such methods and operations.

In an alternative light-responsive embodiment, the present invention can operate as follows. The pixels can include light-sensitive diodes or transistors. The chiplet multi-pixel control elements contain circuitry connected to control signals and power busses. When the light-sensitive diode or transistor of the pixel is exposed to light, current passes through lines to the chiplet and can be stored in charge-storage elements (e.g. capacitors). The charge can then be transferred through signal lines to an external controller. Useful signal and control methods are known in the art. Such an operation can be useful in, for example, large-area image-sensing applications.

The present invention can be employed in any device having a multi-pixel infrastructure and can be employed in either an active-matrix configuration in which the circuitry controls each pixel as an active-matrix element or as a passive-matrix controller. The present invention provides advantages when an increased aperture ratio, improved pixel-control performance, and decreased costs are important. In particular, the present invention can be practiced with active-matrix LED devices, either organic or inorganic, and is particularly useful in information-display devices. In a preferred embodiment, the present invention is employed in a flat-panel OLED device composed of small-molecule or polymeric OLEDs as disclosed in, but not limited to U.S. Pat. No. 4,769,292, issued Sep. 6, 1988 to Tang et al., and U.S. Pat. No. 5,061,569, issued Oct. 29, 1991 to VanSlyke et al. Inorganic devices, for example, employing quantum dots formed in a polycrystalline semiconductor matrix (for example, as taught in US Publication No. 2007/0057263 by Kahen), and employing organic or inorganic charge-control layers, or hybrid organic/inorganic devices can be employed. Many combinations and variations of organic or inorganic light-emitting displays can be used to fabricate such a device, including active-matrix displays having either a top- or a bottom-emitter architecture.

The invention has been described in detail with particular reference to certain preferred embodiments thereof, but it should be understood that variations and modifications can be effected within the spirit and scope of the invention.

PARTS LIST 10 device substrate
12 adhesive and planarization layer
16 via
20 pixel
22 control electrode
24 wire
24A, 24B control electrodes
25 wiring layer
26 light-emitting layer
28 common (top) electrode
30 pixel
32 control electrode
34 wire
40 chiplet
41 circuitry
42 connection pad
43 pixel definition layer
44 chiplet substrate
50 chiplet
52 connection pad
54 chiplet substrate
60 signal and buss lines
60A control wires
61 pad portion
70 electrode portion
72 pad portion
74 stitching point
100 provide substrate step
110 locate chiplets step
112 inspect chiplets step
114 route paths step
120 form wires step
122 form electrode portion step
124 form pad portion step
130 form pixels step
200 deposit conductor step
210 cure conductor step
300 deposit conductor step
310 deposit resin step
320 expose resin step
330 remove resin step
340 etch conductor step

What is claimed is:

1. An active-matrix device, comprising:
a) a device substrate including a plurality of pixels formed thereon, each pixel having a separate control electrode;
b) a plurality of chiplets having at least a first and a second corresponding chiplet disposed at different locations over the device substrate;
c) a plurality of wires formed over the device substrate, each wire being connected to a connection pad and to a different pixel control electrode; and
d) wherein the shape of at least one of the plurality of wires connecting a connection pad for the first chiplet is different from the shape of at least one of the plurality of wires connecting a corresponding connection pad for the second chiplet.

2. An active-matrix device, comprising:
a) a device substrate;
b) a plurality of pixels formed over the device substrate, each pixel including a control electrode;
c) a plurality of chiplets located over the device substrate for controlling one or more of the plurality of pixels, each chiplet having a substrate independent of the device substrate including circuitry and a plurality of connection pads, and wherein each chiplet has a unique pre-determined location and orientation on the device substrate, and a first chiplet corresponding to a second chiplet that has a location or orientation different from the pre-determined location and orientation of the first chiplet; and d) a plurality of wires formed over the device substrate, each wire electrically connecting one of the plurality of connection pads and a different control electrode of one of the plurality of pixels for the first and the second chiplet and wherein the shape of at least one of the plurality of wires connecting a connection pad for the first chiplet is different from the shape of at least one of the plurality of wires connecting a corresponding connection pad for the second chiplet.

3. The active-matrix device of claim 2, wherein each of the plurality of wires has an electrode portion electrically connected to one of the control electrodes and a pad portion electrically connected to one of the plurality of connection pads.

4. The active-matrix device of claim 3, wherein the electrode portions of at least two of the plurality of wires have a similar shape and the pad portions of the at least two wires have a different shape.

5. The active-matrix device of claim 2, wherein the chiplets have one or two rows of connection pads.

6. The active-matrix device of claim 2, wherein the plurality of wires are formed from an evaporated metal or metal alloy, a sputtered metal or metal alloy, or a cured conductive ink.

7. The active-matrix device of claim 2, wherein the plurality of wires are formed in a single layer.

8. The active-matrix device of claim 2, wherein the plurality of chiplets are located in an array over the device substrate or the plurality of pixels are located in an array over the device substrate.

9. The active-matrix device of claim 8, wherein the center of each of the plurality of chiplets is aligned in the array but the rotations of at least two of the plurality of chiplets with respect to the device substrate are different.

10. The active-matrix device of claim 8, wherein the center of one or more of the plurality of chiplets in the array is not aligned in the array.

11. An active-matrix device, comprising:
a) a device substrate having one or more control wires formed thereon;
b) a plurality of pixels formed over the device substrate, each pixel including a control electrode;
c) a plurality of chiplets for controlling one or more of the plurality of pixels and located over the device substrate, each chiplet having a substrate independent of the device substrate including circuitry and a plurality of connection pads, and wherein each chiplet has a pre-determined location and orientation on the device substrate, and a first chiplet corresponding to a second chiplet that has a location or orientation different from the pre-determined location and orientation of the first chiplet; and
d) a plurality of wires formed over the device substrate, each wire electrically connecting one of the plurality of connection pads and a different control electrode of one of a plurality of pixels or a control line for the first and the second chiplet and wherein the shape of at least one of the wires connecting a connection pad for the first chiplet is different from the shape of at least one of the plurality of wires connecting a corresponding connection pad for the second chiplet.

* * * * *